(12) United States Patent
Chan et al.

(10) Patent No.: US 7,592,851 B2
(45) Date of Patent: Sep. 22, 2009

(54) HIGH PERFORMANCE PSEUDO DYNAMIC PULSE CONTROLLABLE MULTIPLEXER

(75) Inventors: Yuen H. Chan, Poughkeepsie, NY (US); Ann H. Chen, Poughquag, NY (US); Antonio R. Pelella, Highland Falls, NY (US); Shie-ei Wang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/021,454

(22) Filed: Jan. 29, 2008

(65) Prior Publication Data

US 2009/0189675 A1    Jul. 30, 2009

(51) Int. Cl.
*H03K 17/00* (2006.01)

(52) U.S. Cl. ............... 327/407; 327/408; 327/409; 327/410; 365/189.02; 365/230.02

(58) Field of Classification Search ......... 327/407–413; 365/189.02, 189.04, 189.14, 189.15, 194, 365/193, 230.02, 233.1
See application file for complete search history.

(56) References Cited

U.S. PATENT DOCUMENTS

| | | | |
|---|---|---|---|
| 5,003,194 A | 3/1991 | Engelhard | |
| 5,594,690 A | 1/1997 | Rothenberger et al. | |
| 5,990,923 A | 11/1999 | Morrison | |
| 6,229,367 B1 | 5/2001 | Choudhury | |
| 6,492,798 B2 * | 12/2002 | Sunter | 324/76.15 |
| 2004/0178838 A1 | 9/2004 | Ngo et al. | |
| 2005/0046458 A1 | 3/2005 | Schroeder et al. | |
| 2005/0077939 A1 | 4/2005 | Fagan et al. | |
| 2005/0077941 A1 | 4/2005 | Fagan et al. | |

* cited by examiner

*Primary Examiner*—Lincoln Donovan
*Assistant Examiner*—Brandon S Cole
(74) *Attorney, Agent, or Firm*—William A. Kinnaman, Jr.

(57) ABSTRACT

A high performance, set associative, cache memory tag multiplexer provides wide output pulse width without impacting hold time by separating the evaluation and restore paths and using a wider clock in the restore path than in the evaluation path. A clock controls the evaluation of the input signals. Its leading edge (i.e., rising edge) turns on NR to allow evaluation, its trailing edge (falling edge) turns off NR to stop evaluation. At this point, when NR is shut off, the inputs can start changing to set up for the next cycle. Hence the hold time of the input is determined by the clock trailing edge.

14 Claims, 5 Drawing Sheets

Schematic of pulse controllable dynamic 4-to-1 multiplexer

Schematic of pulse controllable dynamic 4-to-1 multiplexer

HIGH PERFORMANCE PSEUDO DYNAMIC PULSE CONTROLLABLE MULTIPLEXER

FIELD OF THE INVENTION

This invention relates to high performance, set associative, cache memory systems and more particularly a high performance, dynamic, multiplexer for use in such systems.

BACKGROUND OF THE INVENTION

A set associative, cache memory, of the type to which this invention relates is illustrated in the functional block diagram of FIG. 1, and also described in U.S. Pat. No. 7,054,184 assigned to the assignee of this invention, and incorporated herein by reference. The cache memory system shown in FIG. 1 is a four way, set associative cache memory system. The tag portion of the memory address is used to address the TAG Array RAM. The TAG array consists of 4-Way X 4 of SRAM data. Each of the addressable row in the TAG array represents 4 entries of the cache Set_ID, i.e., a total of 16 data bits per row, or 4 data bits per each 4-way. The TAG array could be 1K, 2K, or 4K ... etc. deep (depending on the cache system implementation). The function of the bits is to identify the associativity set to be selected from the cache. In our example here, the cache is 4 way set associative, hence 4 bits are needed for the Set_ID field. Each bit corresponds to a set. Usually 1 and only 1 of the bits are ON, so that only 1 out of 4 sets is selected from the Cache Macro via the functional block labeled 4-to 1 late select in FIG. 1. As illustrated in FIG. 1, each of four multiplexers provides a 4-to-1 select function and the four combined provide the 16-to-4 select function whose four outputs comprise the Set-id (4) field.

FIG. 3 is a schematic diagram of a prior art dynamic 4-to-1 multiplexer of the type used in the prior art to generate one of the Set-id inputs to the Cache Macro late select function. It has a low active clock signal and includes four pull down transistor pairs. Each pair is comprised of a select transistor, here an N type Field Effect Transistor (NFET) with inputs (sel<0>, sel<1>, sel<2>. and sel<3>) and data transistor, another NFET with inputs (in <0>, in <1>, in <2>, and in <3>). Also illustrated here is an NFET pull down pair with inputs abist_sys_sel and abist_sys_in, which is used in a Built In Self Test mode of operation initiated by the test control logic. There is a 6th input labeled "lbist" which is an override signal supplied by the LBIST (Logic Built In Self Test) control logic. The lbist input is used to override the other inputs and force the multiplexer circuit to generate a selected output state.

An inverter connects the clock signal ck1 to the gates of PFET PRS1 and NFET NR. When the clock is in its standby high state, PRS1 turns on and NR turns off. During the clock standby state, PRS1 pre-charges node N by connecting it to a positive voltage source Vdd, pre-charging the node N high. Node N is connected to the multiplexer output "out_c". A four transistor flip-flop coupled to the output maintains the state of the output out_c in either a logic high state or a logic low state until the potential on node N drops below or rises above the switching threshold of the flip-flop. The flip-flop transistors are constructed with small size devices, so that they could be over powered by the switching of node N during circuit restore or evaluation. When the clock signal falls to its low activate state, PRS1 turns off and NR turns on. Pre-charged node N stays high (being held high by the flip-flop latch. Select signals sel_0, sel_1, sel_2, or sel_3 turns on the evaluation NFETs. The sel_0 to sel_3 are orthogonal signals. In normal mode operation, only one, or none, of theses signals will be on (high), hence only one, or none, of the four NFET pairs will be active at a time. Which pair, if any, of the pull down pairs conducts depends on the content of the TAG Array RAM at the tag memory address. When both transistors of a pull down pair conduct, the pre-charged voltage at node N drops as the node discharges through the pull down pair and transistor NR to a sink, indicated as ground here. The output out_c on one of the four Set-ID lines drops, producing the leading edge of an output pulse on out_c. When the clock ck1 goes high, PRS1 turns on, NR turns off, the voltage on out_c rises, producing the trailing edge of the output pulse, and starting the recovery process for the next cache access.

It will be appreciated that the inputs to the multiplexer from the TAG Array RAM must be stable before the clock signal switches to its active state, and remain stable throughout the duration of the clock signal active state. The time allowed for the inputs to reach a stable state is known as the Set-up Time and the time during which the inputs must remain stable during the active state of the clock signal is known in the art as the Hold Time. In the prior art dynamic multiplexer of FIG. 3, the Set-up time, the Hold Time, and the width of the dynamic output pulse out_c are tied to one another. In the prior art, the multiplexer output pulse width is determined by the ck1 pulse width. A wide Set_ID pulse is needed in order to ensure proper and robust late select dynamic circuit operation at the cache. But an increase in the width of the ck1 clock pulse increases the hold time and a resultant degradation of cache performance.

SUMMARY OF THE INVENTION

An object of this invention is the provision of a high performance, set associative, cache memory systems in which the tag memory multiplexer output pulse width (SET_ID) can be increased without increasing the multiplexer's input hold time.

Briefly, this invention contemplates the provision of a high performance, set associative, cache memory tag multiplexer that provides wide output pulse width without impacting hold time by separating the evaluation and restore paths and using a wider clock in the restore path than in the evaluation path. A clock controls the evaluation of the input signals. Its leading edge (i.e., rising edge) turns on NR to allow evaluation, its trailing edge (falling edge) turns off NR to stop evaluation. At this point, when NR is shut off, the inputs can start changing to set up for the next cycle. Hence the hold time of the input is determined by the clock trailing edge. This clock signal is also delayed thru a delay chain to generate a delayed trailing edge signal to control the output restore path.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
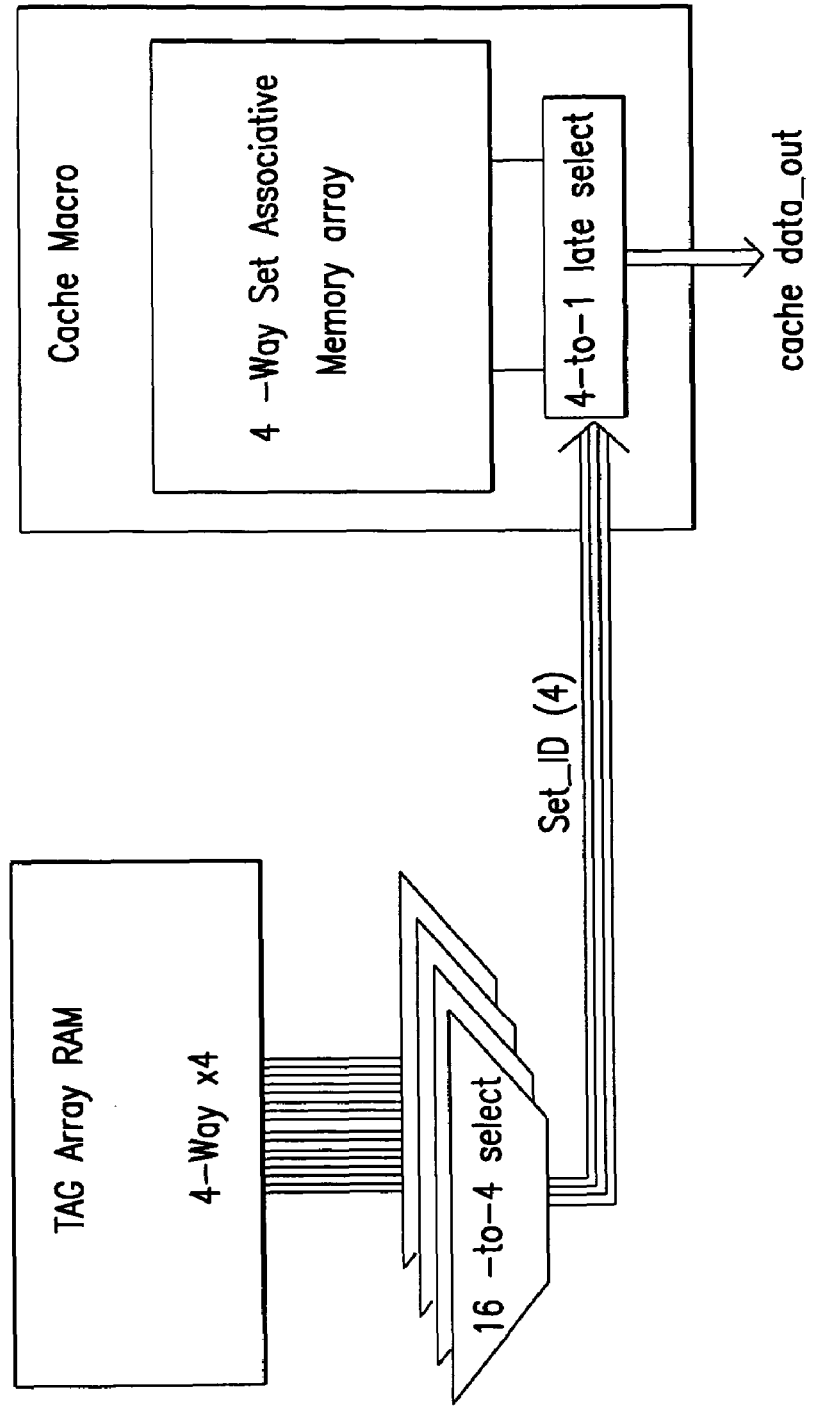
FIG. 1 is a block diagram of a typical four way, set associative cache memory employing a late select multiplexer.
Figure 2:
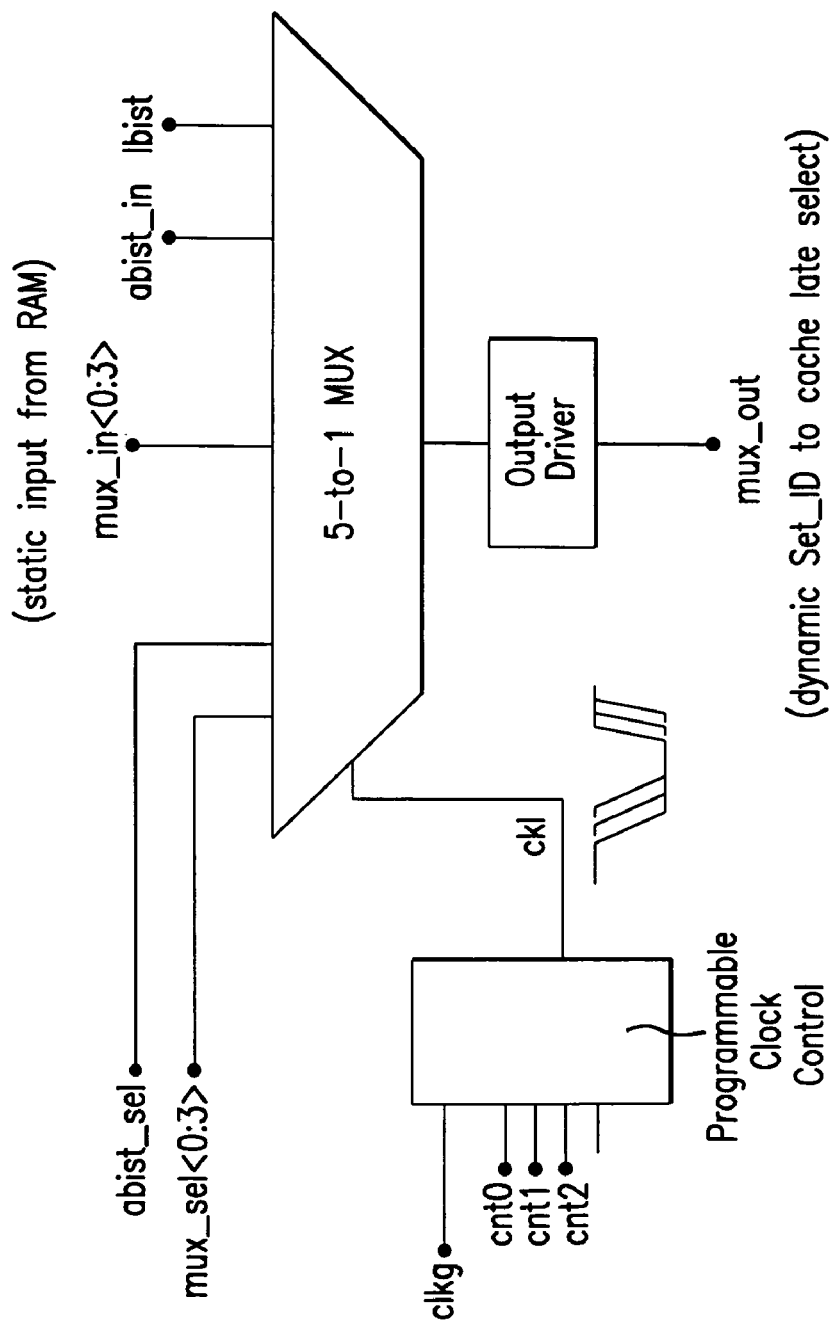
FIG. 2 is a block diagram showing the programmable control of the clock input to the late select multiplexer in accordance with the teachings of this invention.

Referring now to FIG. 2, a Programmable Clock Control is added to the system to control the pulse width and arrival time (i.e., the delay of ck1 from the system clock) of the clock signal ck1 and provide added flexibility. Both the leading and trailing edges of ck1 are adjustable with programmable timing bits cnt0-cnt1-cnt2 . . . .

Figure 3:
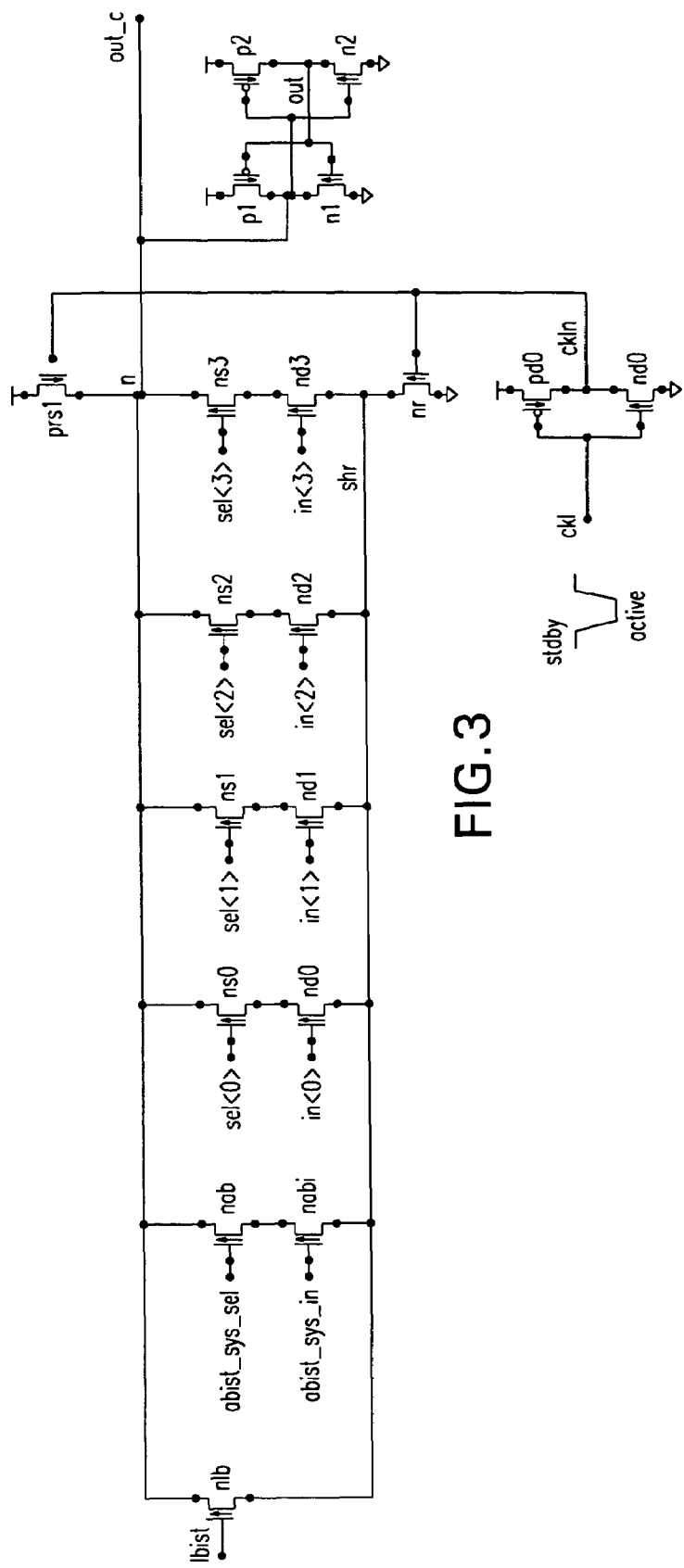
FIG. 3 is a schematic diagram of a prior art late select multiplexer used in the system of FIG. 1.
Figure 4:
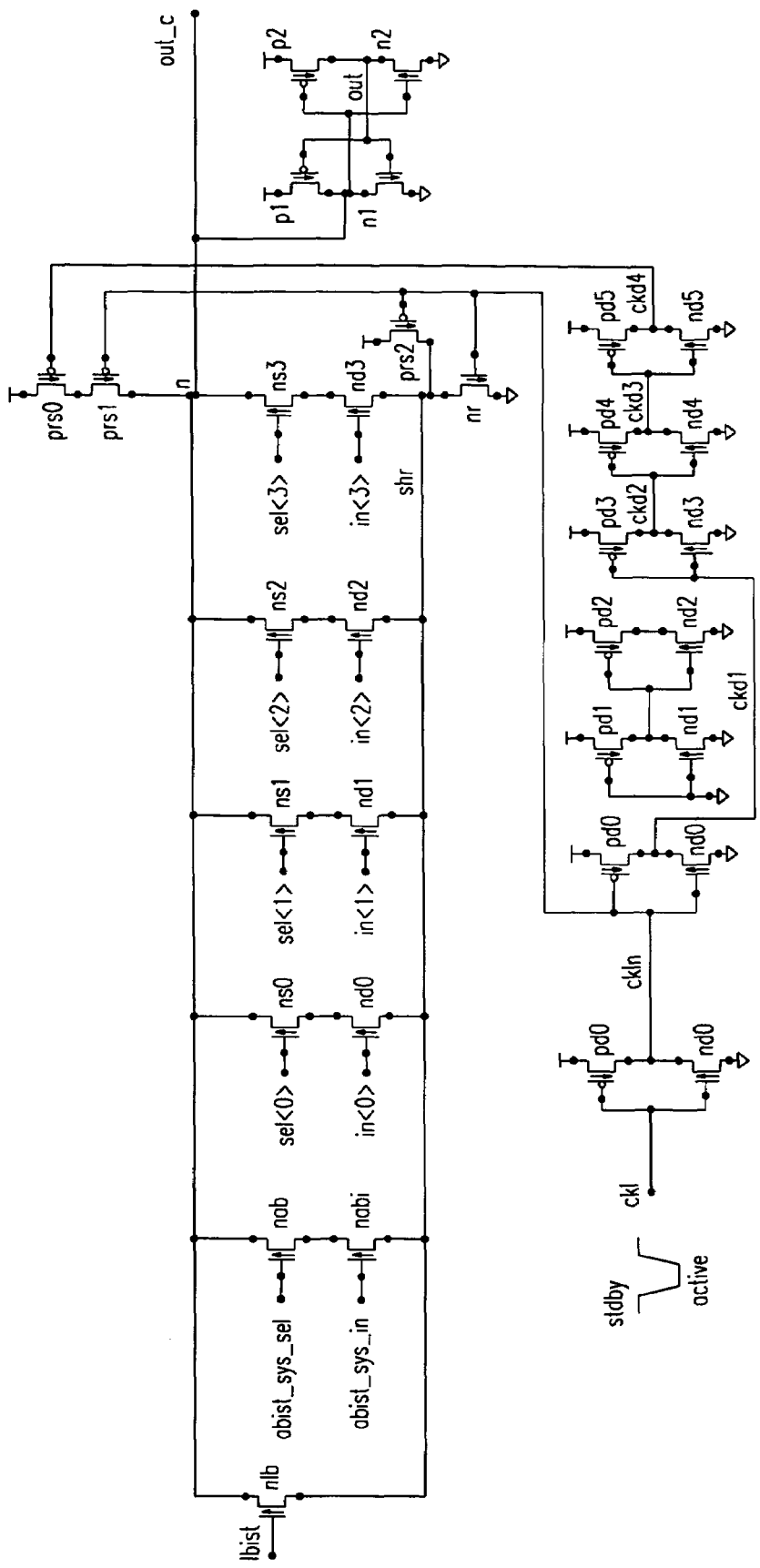
FIG. 4 is a schematic diagram of a specific embodiment of a programmable clock controlled late select multiplexer in accordance with the teachings of this invention.

As can be seen from an inspection of FIG. 4, the evaluation phase of the multiplexer shown in FIG. 4 is essentially the same as the evaluation phase in FIG. 3. In response to the leading (here rising) edge of the clock signal ck1n, PRS1 turns off, allowing the pre-charged output node N to held high by the flip-flop latch. This leading edge also turns on NR. If both transistors of a pull down pair conduct, they pull down the output node N through NR, creating the leading (here falling) edge of an output pulse on the output out_c. Thus, the clock signal ck1n controls the evaluation phase of the input signals. Its leading edge (i.e., rising edge) turns on NR to allow evaluation, its trailing edge (falling edge) turns off NR to stop evaluation. At this point, when NR is shut off, the inputs "sel" and "in" can start changing to set up for the next cache fetch cycle. Hence the hold time required for these inputs is determined by the location in time of ck1n trailing edge.

The clock signal ck1n is delayed to generate clock signal ckd4 whose trailing edge (falling edge) starts the output restore process. In this specific embodiment a delay chain comprised of four inverter stages generates ckd4. As shown the four stages can be expanded to six stages with a simple art work addition to connect the two additional stages shown in the chain. When the trailing edge (falling edge) of ckd4 arrives, PRS0 is turned on (at this time, PRS1 has already been also turned on since the trailing/falling edge of ck1n signal arrived earlier than the ckd4 signal). The node N will then be connected to Vdd through PRS0 and PRS1 so that node N and the output out_c will rise. The separated evaluation and restore circuit paths and the delaying the trailing edge of the restore clock ckd4 relative the trailing edge of the evaluation clock ck1n generates a wider output pulse width. Yet, since the evaluation clock's (ckln) trailing edge (closing of evaluation) is not delayed, the hold time required for the "sel" and "in" input signals remain the same.

The function of the PFET PRS2 in FIG. 4 is to restore (pull up) node "shr". This avoids a charge redistribution problem at node shr, which is a heavily loaded node due to the large number of devices on it. The charge redistribution problem can cause false switching (false evaluation) of the circuit.

Figure 5:
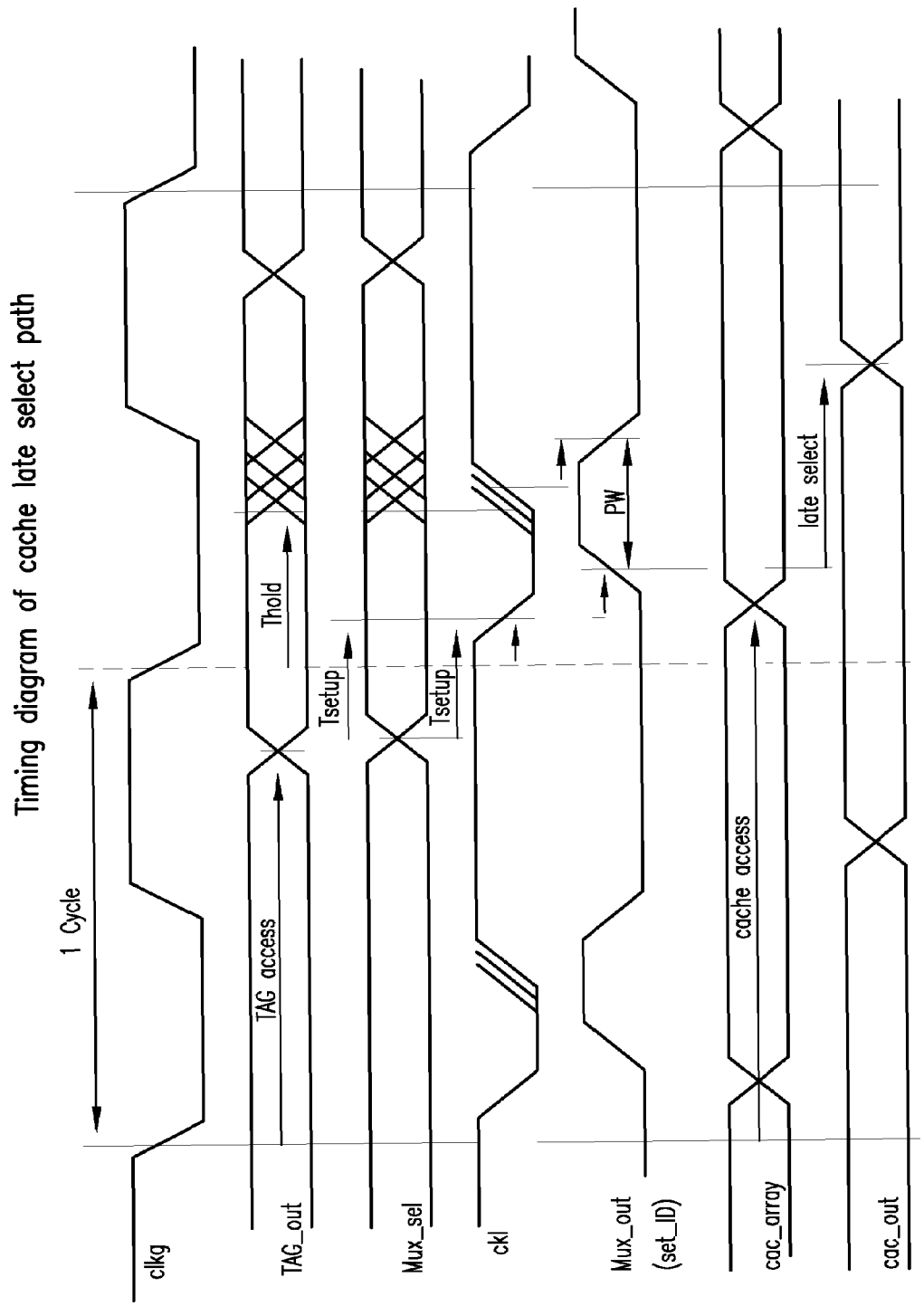
FIG. 5 is a timing diagram illustrating the relative timing of the operation of the cache system of this invention shown in FIGS. 3 and 4.

FIG. 5 is a timing diagram that graphically illustrates the timing considerations explained in connection with FIGS. 2 and 4. The top line clkg represents the system clock as a point of reference. In the second line, TAG-out, the TAG access interval is the interval the system provides to access the TAG data. Tsetup is the time allotted for the tag data to become stable as inputs to the multiplexer. These input signals are static and must be stabilized before the clock (ck1) is active. Hence the allotted interval is measured to the leading edge of the clock ck1, in this example the falling edge of the clock. Thold is the time of the data and select inputs to the multiplexer must hold steady. The input signals must remain unchanged when the clock ck1 is active. Hence, the hold time is measured to the trailing edge of the ck1 clock. Keeping the hold time to a minimum supports high frequency cache operation. The Mux-sel time line is similar to the TAG-out time line, but illustrates the possibility of a small but appreciable delay between the output of the TAG memory and the data inputs to the multiplexer from the TAG memory. The next line shows the multiplexer clock signal ck1. The three parallel trailing edges represent possible locations in time of the trailing edge of the restore clock ckd4 depending on the amount delay. The next line Mux-out represents the dynamic output pulse of the multiplexer. The pulse width PW should be wide enough to guarantee robust operation of late select circuits in the cache macro. The last two lines represent the relative timing of the cache access on the cac-array line and late select cache output on the cac-out line.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A dynamic multiplexer for generating a late select pulse signal in a set associative cache memory, comprising in combination:

a plurality of pull down transistor pairs coupled in parallel between a pre-charged node and an evaluation node;

said late select output coupled to said pre-charged node;

a first restore transistor switch and a second restore transistor switch connected in series between a pre-charge voltage source and said pre-charge node;

an evaluation transistor switch coupling said evaluation node to common sink;

a clock signal having leading edge and a trailing edge;

a delay circuit coupled having a delay circuit input and a delay circuit output;

said clock signal coupled to said delay circuit input and generating a delayed clock signal having a delayed leading edge and a delayed trailing edge at said delay circuit output;

said clock signal coupled to said first restore transistor and said evaluation transistor so that the leading edge of said clock signal turns off said first restore transistor and turns on said evaluation transistor, and said trailing edge turns on said first restore transistor and turns off said evaluation transistor;

said delayed clock signal coupled to said second restore transistor switch so that the delayed leading edge turns off said second restore transistor switch and said delayed trailing edge turns on said second restore transistor;

whereby an output pulse is generated at said output whose pulse width is established by the interval between the leading edge of said clock pulse and said delayed trailing edge.

2. A dynamic multiplexer for generating a late select pulse signal in a set associative cache memory as in claim 1 further including programmable clock control to control the pulse width of the delay clock relative a system clock.

3. A dynamic multiplexer for generating a late select pulse signal in a set associative cache memory as in claim 2 further including programmable clock control to control the arrival time of the delay clock relative a system clock.

4. A dynamic multiplexer for generating a late select pulse signal in a set associative cache memory as in claim 3 further including a transistor to restore the evaluation node.

5. A dynamic multiplexer for generating a late select pulse signal in a set associative cache memory as in claim 3 wherein said transistors are field effect transistors.

6. A dynamic multiplexer for generating a late select pulse signal in a set associative cache memory as in claim 2 further including a transistor to restore the evaluation node.

7. A dynamic multiplexer for generating a late select pulse signal in a set associative cache memory as in claim 2 wherein said transistors are field effect transistors.

8. A dynamic multiplexer for generating a late select pulse signal in a set associative cache memory as in claim 1 further including programmable clock control to control the arrival time of the delay clock relative a system clock.

9. A dynamic multiplexer for generating a late select pulse signal in a set associative cache memory as in claim 8 further including a transistor to restore the evaluation node.

10. A dynamic multiplexer for generating a late select pulse signal in a set associative cache memory as in claim 8 wherein said transistors are field effect transistors.

11. A dynamic multiplexer for generating a late select pulse signal in a set associative cache memory as in claim 1 further including a transistor to restore the evaluation node.

12. A dynamic multiplexer for generating a late select pulse signal in a set associative cache memory as in claim 11 wherein said transistors are field effect transistors.

13. A dynamic multiplexer for generating a late select pulse signal in a set associative cache memory as in claim 1 wherein said transistors are field effect transistors.

14. A dynamic multiplexer for generating a late select pulse signal in a set associative cache memory, comprising in combination:

a plurality of pull down means coupled between a pre-charged node and an evaluation node;

said late select output coupled to said pre-charged node;

a first restore means and a second restore means connected in series between a pre-charge voltage source and said pre-charge node;

an evaluation means coupling said evaluation node to common sink;

a clock signal having leading edge and a trailing edge;

means for delaying said clock signal generating a delayed clock signal having a delayed leading edge and a delayed trailing edge;

said clock signal coupled to said first restore means and said evaluation means so that the leading edge of said clock signal turns off said first restore means and turns on said evaluation means, and said trailing edge turns on said first restore means and turns off said evaluation means;

said delayed clock signal coupled to said second restore means so that the delayed leading edge turns off said second restore means and said delayed trailing edge turns on said second restore means;

whereby an output pulse is generated at said output whose pulse width is established by the interval between said leading edge of said clock pulse and said delayed trailing edge.

* * * * *